(12) United States Patent
Jiroku

(10) Patent No.: US 7,148,511 B2
(45) Date of Patent: Dec. 12, 2006

(54) ACTIVE MATRIX SUBSTRATE, ELECTRO-OPTICAL DEVICE, ELECTRONIC DEVICE, AND METHOD FOR MANUFACTURING AN ACTIVE MATRIX SUBSTRATE

(75) Inventor: Hiroaki Jiroku, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/157,793

(22) Filed: Jun. 22, 2005

(65) Prior Publication Data

US 2006/0027811 A1 Feb. 9, 2006

(30) Foreign Application Priority Data

Aug. 5, 2004 (JP) ............... 2004-229817

(51) Int. Cl.
*H01L 29/04* (2006.01)
*H01L 29/15* (2006.01)
*H01L 31/036* (2006.01)

(52) U.S. Cl. .............. 257/72; 257/59; 257/88; 257/202; 257/291; 257/390; 257/E27.11; 257/E27.121; 257/E25.028; 438/157; 438/405; 438/417

(58) Field of Classification Search ............ None
See application file for complete search history.

(56) References Cited

U.S. PATENT DOCUMENTS 6,140,667 A * 10/2000 Yamazaki et al. ............ 257/59

2004/0108989 A1* 6/2004 Gyouten et al. ............ 345/100
2004/0130520 A1* 7/2004 Maeda et al. ............... 345/100
2004/0233503 A1* 11/2004 Kimura ....................... 359/275
2005/0030265 A1* 2/2005 Miyagawa .................... 345/76

FOREIGN PATENT DOCUMENTS

JP A 5-134272 5/1993

OTHER PUBLICATIONS

"Single Crystal Thin Film Transistors, " IBM Technical Disclosure Bulletin, pp. 257-258, Aug. 1993.
Ishihara et al., Advanced Excimer-Laser Crystallization Techniques of Si Thin-Film for Location Control of Large Grain on Glass, Flat Panel Display Technology and Display Metrology II, Proceedings of SPIE, vol. 4295, pp. 14-23, 2001.

* cited by examiner

Primary Examiner—Evan Pert
Assistant Examiner—Victor A. Mandala, Jr.
(74) Attorney, Agent, or Firm—Oliff & Berridge, PLC

(57) ABSTRACT

An active matrix substrate includes a load circuit including a first active element performing a switching operation of a load, the first active element including a semiconductor film of a substantially polycrystalline state; a drive circuit including a second active element controlling driving the load, the second active element including a semiconductor film of a substantially single crystalline state, a hole being provided to one of a part and a peripheral part of the semiconductor film, the hole functioning a starting point for crystallizing the semiconductor film; and a substrate on a same plane of which the load circuit and the drive circuit are formed.

8 Claims, 7 Drawing Sheets

ACTIVE MATRIX SUBSTRATE, ELECTRO-OPTICAL DEVICE, ELECTRONIC DEVICE, AND METHOD FOR MANUFACTURING AN ACTIVE MATRIX SUBSTRATE

BACKGROUND

The present invention relates to an active matrix substrate, an electro-optical device, an electronic device, and a method for manufacturing an active matrix substrate.

In various electronic devices such as liquid crystal display devices having a plurality of pixels, organic EL display devices, image sensors, etc., a switching operation of pixels (loads) is performed by using semiconductor devices (e.g. TFTs, etc., hereinafter TFT) formed on glass substrates or quartz substrates. On the substrates, a pixel circuit including a number of TFTs that perform the switching operation of pixels and a drive circuit including a number of TFTs that control driving of each pixel are formed.

In order to improve performance of TFTs formed on glass substrates, etc., various techniques have been examined in which a semiconductor film made of a large crystal grain is formed so as to form a channel forming region of a TFT with a substantially single crystal grain. For example, a technique in which a semiconductor film of a substantially single crystal state is formed by crystallizing a semiconductor film using a micro hole formed on a substrate as a starting point for growing a crystal is disclosed in the following examples: Single Crystal Thin Film Transistor, IBM Technical Disclosure Bulletin, Aug. 1993, pp 257–258; and Advanced Excimer-Laser Crystallization Techniques of Large Grain on Glass. R. Ishihara, et al., Proc. SPIE 2001, vol. 4295, pp 14–23.

By forming a TFT using a semiconductor film of a substantially single crystalline state, a forming region of one TFT (particularly, a channel region) can be constructed with one substantially single crystal grain. This makes it possible to realize a semiconductor device having exceptional electrical characteristics in field effect mobility, etc.

By using such TFT having exceptional electrical characteristics, a drive circuit that operates at high speed with high functions can be formed on a glass substrate or a quartz substrate. However, using a single crystal for a semiconductor film of a TFT causes a problem of a type of body floating effect called parasitic bipolar effect that is seen in silicon on insulator (SOI) devices. The resulting parasitic bipolar effect causes various problems such as dropping a breakdown voltage between source and drain, an abnormally steep sub-threshold characteristic exceeding theoretical limit, increasing an off current, dropping a threshold voltage, etc.

In order to solve the problems, a technique is proposed, for example, in the Japanese Unexamined Patent Publication No. 5-134272. In the technique, a TFT included in a drive circuit is formed using a semiconductor film of a substantially single crystalline state, while a TFT included in a pixel circuit is formed using a semiconductor film of a substantially polycrystalline state.

In the TFT formed using the semiconductor film of the polycrystalline state, the above-mentioned problems seldom occur in commonly used voltage level due to a short life (life time) of minority carrier. This makes it possible to form a drive circuit that can operate at high speed with exceptional electrical characteristics, and a pixel circuit having a low off current.

However, the technique disclosed in the Japanese Unexamined Patent Publication No. 5-134272 has a problem in that a semiconductor film of a single crystal state is formed at high temperature. Specifically, a temperature of 960 degrees centigrade is required to form a single crystal silicon film by reduced pressure epitaxy, while a temperature of 600 degrees centigrade is required to form a single crystal silicon film by solid phase epitaxy. Such manufacturing method required high temperature has a problem in that expensive fused quartz substrates, etc., should be used whereas inexpensive glass substrates or plastic substrates can not be used.

SUMMARY

An advantage of the invention is to realize that an active matrix substrate is formed by a low temperature process. The substrate includes a drive circuit that can operate at high speed and a load circuit having a low off current.

An active matrix substrate according to one aspect of the invention includes a load circuit including a first active element performing a switching operation of a load, a drive circuit including a second active element controlling driving of the load, and a substrate on a same surface of which the load circuit and the drive circuit are formed. A semiconductor film included in the first active element is a substantially polycrystalline state, while a semiconductor film included in the second active element is a substantially single crystalline state. A hole is provided to a part or a peripheral part of the semiconductor film included in the second active element. The hole that functions as a starting point for crystallizing the semiconductor film included in the second active element. In contrast, no hole that functions as a starting point for crystallizing the semiconductor film is provided to a part or a peripheral part of the semiconductor film included in the first active element.

According to the construction, the hole is provided to a part or a peripheral part of each semiconductor film included in the drive circuit whereas no hole is provided to a part or a peripheral part of each semiconductor film included in the load circuit. When heat treatment is applied to the semiconductor film formed on the substrate, in a region where the hole is present and the drive circuit is formed, a semiconductor film of a substantially single crystalline state is formed from the hole as the center. In contrast, in a region where no hole is present and the load circuit is formed, the semiconductor film is fully melted by the heat treatment so as to be polycrystallized, so that a semiconductor film of a substantially polycrystalline state is formed.

When the semiconductor film (amorphous silicon film, etc.) is melted by the heat treatment, it is brought up to a high temperature. However, the melting and solidification occur in extremely short period (approximately several tens ns). Therefore, this process is substantially regarded as a low temperature process, thereby bringing an advantage in that inexpensive glass substrates or plastic substrates can be used as an element substrate.

The resulting drive circuit can operate at high speed because it is constructed with the second active element (TFT, etc.) having a semiconductor film of a substantially single crystalline state. In contrast, the resulting load circuit (pixel circuit, etc.) can achieve exceptional characteristics in which parasitic bipolar effect or an off current is suppressed because it is constructed with the first active element (TFT, etc.) having a semiconductor film of a substantially polycrystalline state.

Here, the load circuit may include a plurality of scan lines, a plurality of data lines provided so as to intersect each scan line, and a plurality of pixel electrodes each of which is provided at the intersection of each scan line and each data line.

In addition, the active matrix substrate is applied to electro-optical devices. The electro-optical devices are not particularly limited. A liquid crystal display device in which a liquid crystal layer can be driven by an active matrix driving method, a field emission display device in which a field emission layer can be driven by an active matrix driving method, etc., can be exemplified. An example of construction of a liquid crystal display device is specifically described as follows: it is constructed with the active matrix substrate, a facing substrate, and a liquid crystal layer. The facing substrate of which a common electrode is provided on one surface is disposed to the active matrix substrate so that the common electrode and the pixel electrode on the active matrix substrate are faced. The liquid crystal layer is sandwiched between the active matrix substrate and the facing substrate.

In addition, the active matrix substrate is applied to various electronic devices. The electronic devices are not particularly limited. For example, devices equipped with a display device composed of a field emission element can be applied. Examples include cellular phones, video cameras, personal computers, head mount displays, rear or front projectors, fax-machines built-in displays, digital camera finders, portable TVs, DSP devices, PDAs, electronic notebooks, etc.

BRIEF DESCRIPTION OF THE DRAWINGS

The invention will be described with reference to the accompanying drawings, wherein like numbers refer to like elements, and wherein.

DETAILED DESCRIPTION OF EMBODIMENTS

Below, embodiments according to the invention will now be described with reference to the accompanying drawings.

A. First Embodiment

Figure 1:
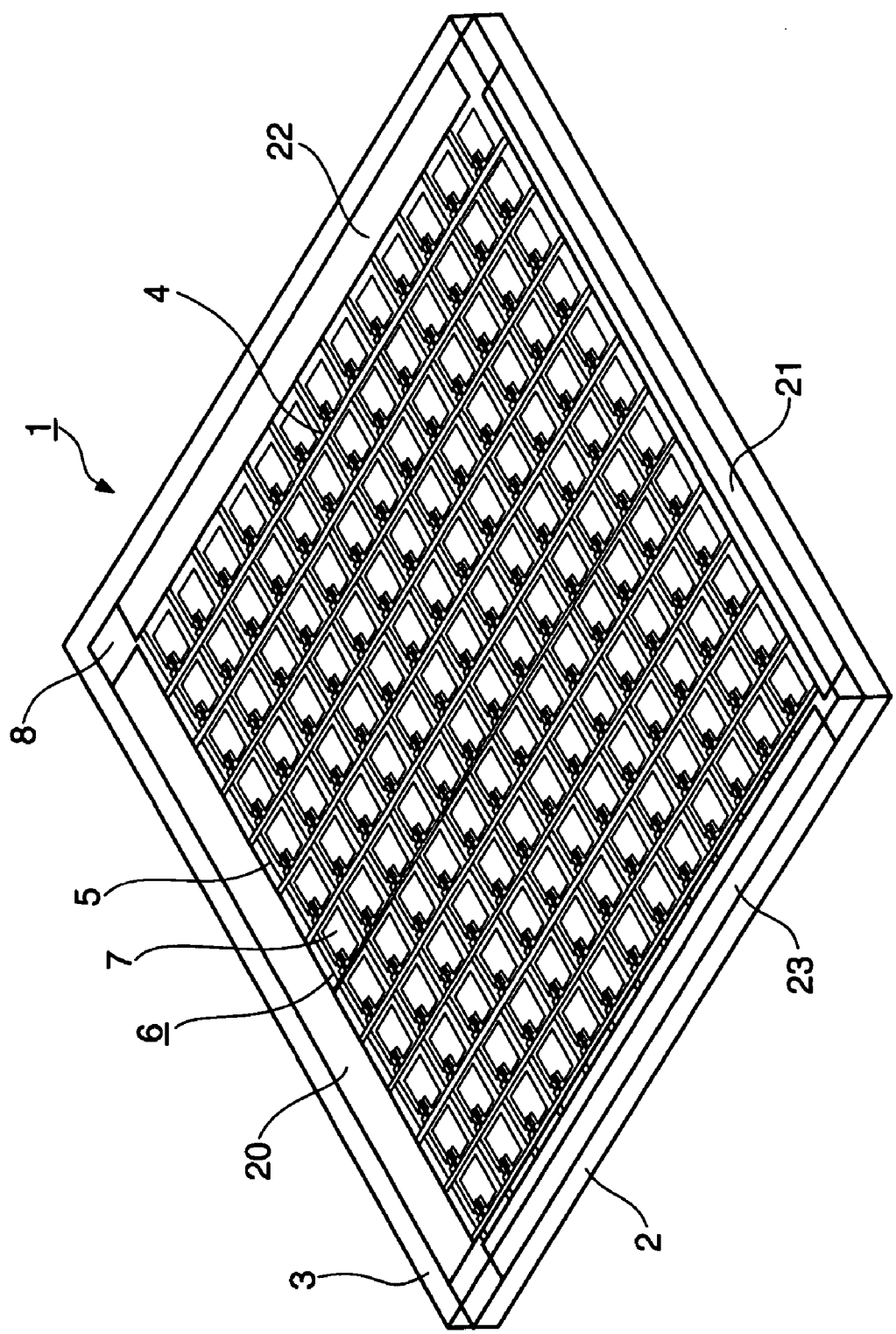
FIG. 1 is a diagram illustrating a construction of a liquid crystal display device according to a first embodiment of the invention.

FIG. 1 shows an active matrix transmission liquid crystal display device 1 using a TFT according to a first embodiment of the invention.

As shown in FIG. 1, a surface on which a TFT 6 is formed of an element substrate 2 and a facing substrate 3 are faced in a liquid crystal display device 1. Between the element substrate (active matrix substrate) 2 and the facing substrate 3, a liquid crystal layer (not shown) is sealed that composed of liquid crystal having a positive anisotropy of dielectric constant.

The liquid crystal display device 1 is constructed by including a display pixel region and a drive circuit region. In the display pixel region, a pixel circuit is formed in which a plurality of source lines (data lines) 4 and a plurality of gate lines (scan lines) 5 are intersected. In the drive circuit region, a drive circuit is formed that supplies a driving signal to source lines 4 and the gate lines 5.

At an intersection of each of the source lines 4 and each of the gate lines 5 that are disposed on the inside surface of the element substrate 2, the TFT (a first active element) 6 is formed that performs a switching operation of each corresponding pixel electrode 7 (load). In other words, one TFT 6 and one pixel electrode 7 are disposed to each pixel arranged in a matrix. In addition, on the inside surface of the facing substrate 3, a common electrode 8 is formed so as to entirely cover the display pixel region in which a plurality of pixels are arranged in a matrix.

Moreover, drive circuits (source drivers) 20 and 21 that control driving a pixel connected to the TFT 6 are formed on the inside surface of the element substrate 2 as well as the TFT 6. The drive circuits 20 and 21 are constructed by including a plurality of TFTs (second active elements) that are not shown. The drive circuits 20 and 21, to which a control signal is supplied from a control circuit (not shown), generate a drive signal (data signal) for driving each TFT 6 based on the control signal. The other drive circuits (gate drivers) 22 and 23 that control driving a pixel connected to the TFT 6 are also constructed by including a plurality of TFTs as well as the drive circuits 20 and 21. The drive circuits 22 and 23 generate a drive signal (data signal) for driving each TFT 6 based on a supplied control signal.

In the embodiment, a semiconductor film of a micro-polycrystalline state (fine grain size and a polycrystalline state) is used as a semiconductor film for the TFT 6 included in the pixel circuit, whereas a semiconductor film of a substantially single crystalline state is used as a semiconductor film for the TFT included in the drive circuit. Manufacturing processes of the TFT 6 included in the pixel circuit and the TFT included in the drive circuit will be described below.

Micro Hole Forming Process

Figure 2A:
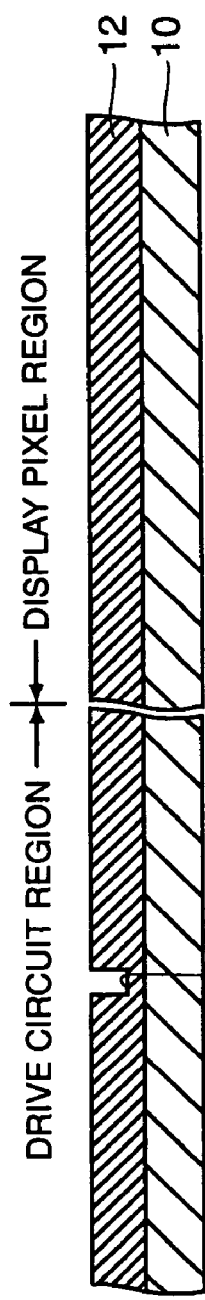
FIGS. 2A through 2D are diagrams illustrating a manufacturing process of each TFT according to the first embodiment.

First, as shown in FIG. 2A, a silicon oxide film 12 is formed on a substrate 10 such as a glass substrate or a quartz substrate, etc., as an insulation film. Methods for forming the silicon oxide film 12 on the substrate 10 include a plasma enhanced chemical vapor deposition (PECVD), a low pressure chemical vapor deposition (LPCVD), a physical vapor deposition method such as sputtering, etc. For example, the silicon oxide film 12 of a thickness of several hundreds nm can be formed by means of a PECVD.

Then, a micro hole 14 is formed at a predetermined position of the silicon oxide film 12. The micro hole 14 is formed in multiple numbers in the drive circuit region in which the drive circuit is arranged whereas is not formed in the display pixel region in which the pixel circuit is arranged. Refer to FIG. 2A; details will be described later. The micro hole 14 that is circular in cross-section of a diameter of approximately 0.1 μm is formed at a predetermined position of the silicon oxide film 12 by means of photolithography, etching, etc. It is arbitrary which etching method is employed. For example, a reactive ion etching can be employed in which $CHF_3$ gas plasma is used. In a case where a diameter of the micro hole 14 is approximately 0.5

µm, the diameter of the micro hole 14 can be reduced to approximately 0.1 µm by depositing additional silicon oxide film over the entire surface of a substrate having the micro hole 14.

Film Forming Process

Figure 2B:
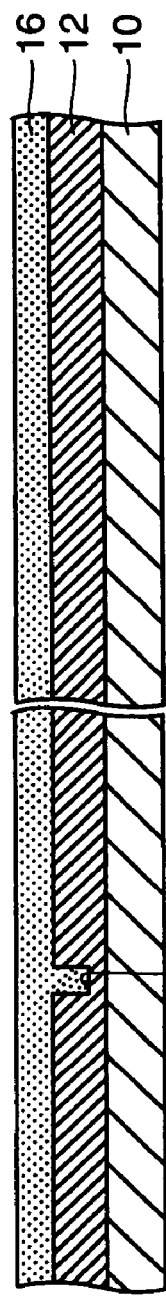

Next, as shown in FIG. 2B, an amorphous silicon film 16 that will serve as a semiconductor film is formed on the silicon oxide film 12 and inside the micro hole 14. Methods for forming the amorphous silicon film 16 include a PECVD, a LPCVD, a physical vapor deposition method such as sputtering, etc. The amorphous silicon film 16 also may be formed by heat treatment after applying a liquid material containing a semiconductor material. In the embodiment, the following solution is supplied by a droplet discharge method (inkjet method) as the liquid material: a solution containing a silicon compound in which the group 5 elements such as phosphorus, etc., or the group 3 elements such as boron etc., are added as a dopant source, or a solution containing two silicon compounds, one of which is denatured with the group 3 or group 5 elements, and the other is not denatured by them. Methods other than the droplet discharge method (e.g. spin coating, etc.) also may be used for supplying a liquid material. A concentration of a substance serving as a dopant source is adjusted accordingly to control electrical characteristics (particularly threshold voltage: Vth) of thin film transistors.

Here, as for the silicon compound contained in the liquid material, a higher silane, such as cyclopentasilane ($Si_5H_{10}$) etc., is preferably used that is produced by photo polymerizing one having one or more cyclic structures with an irradiated ultraviolet ray. In this case, it is more preferable that an ultraviolet ray is irradiated after mixing a phosphor compound or a boron compound so as to achieve a higher silane compound in which the phosphor or boron compound is included in a photo polymerization. Solvents for forming a liquid material are not particularly limited as long as they dissolve a silicon compound and do not react to the silicon compound. One having a vapor pressure of 0.001 to 200 mmHg at room temperature is preferred. Hydrocarbon solvents such as benzene, toluene, etc., are exemplified as such solvent.

Melt Crystallization Process

Figure 2C:
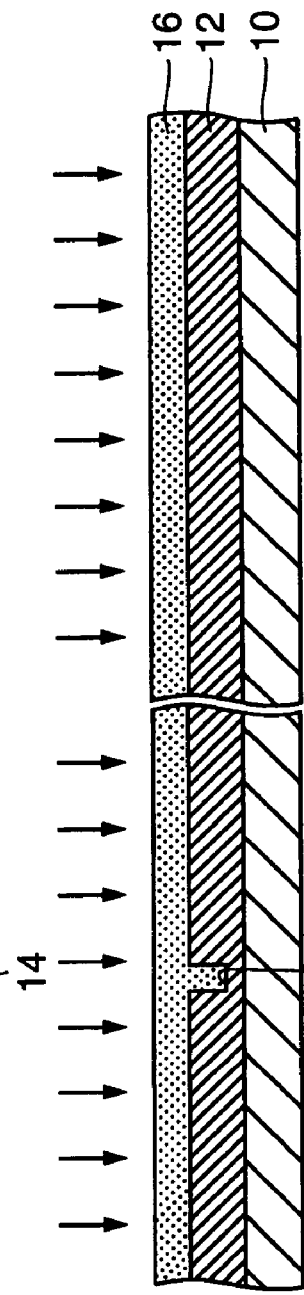

Next, as shown in FIG. 2C, the amorphous silicon film 16 is subjected to heat treatment (laser annealing) by irradiating laser light so as to be partially melted. Preferable laser light for irradiating the amorphous silicon film 16 includes as follows: KrF eximer laser light having a wavelength of approximately 248 nm; XeCl pulse eximer laser light having a wavelength of approximately 308 nm; the second harmonic of Nd:YAG laser light having a wavelength of approximately 532 nm; the second harmonic of Nd:YVO4 laser light having a wavelength of approximately 532 nm; the fourth harmonic of Nd:YAG laser light having a wavelength of approximately 266 nm; and the fourth harmonic of Nd:YVO4 laser light having a wavelength of approximately 266 nm, etc. Upon irradiating the light to the amorphous silicon film 16, the amorphous silicon film 16 is melted and solidified to crystallize as will be described later.

When the amorphous silicon film 16 is melted, it is brought up to a high temperature. However, the melting and solidification occur in extremely short period (approximately several tens ns). Thus, this process is substantially regarded as a low temperature process. Consequently, in the embodiment, this brings an advantage in that inexpensive glass substrates or plastic substrates can be used as the element substrate 2. Here, a light absorption coefficient of the silicon film has a tendency that the shorter wavelength of light, the higher absorption coefficient. Thus, light can effectively be absorbed in the silicon film by setting a wavelength of laser light to be short. Regarding the lasers, the eximer laser has an advantage in that it is easy to use since it is widely and generally used, but a lot of time and costs are required for maintaining devices. In contrast, solid lasers such as YAG lasers, etc., have an advantage in that the devices are easy to maintain. Thus, which laser is employed can be arbitrarily set and changed.

Here, as for the laser light for irradiating the amorphous silicon film 16, the XeCl pulse eximer laser light (a wavelength of 308 nm, a pulse width of 30 ns) is used as an example. By optimizing an energy density of laser light irradiated to the amorphous silicon film 16, the amorphous silicon film 16 that is present in the display pixel region is almost fully melted across its film thickness direction. In contrast, the amorphous silicon film 16 (specifically, the amorphous silicon film inside the micro hole 14) that is present in the drive circuit region is in a state in which its surface is melted but the film 16 at the bottom of the micro hole 14 is not melted (in a partially melted state). Here, if the energy density of laser light were too high, the silicon film would be damaged. In contrast, if the energy density were too low, the silicon film would become wholly a polysilicon film with or without the micro hole 14.

Figure 2D:
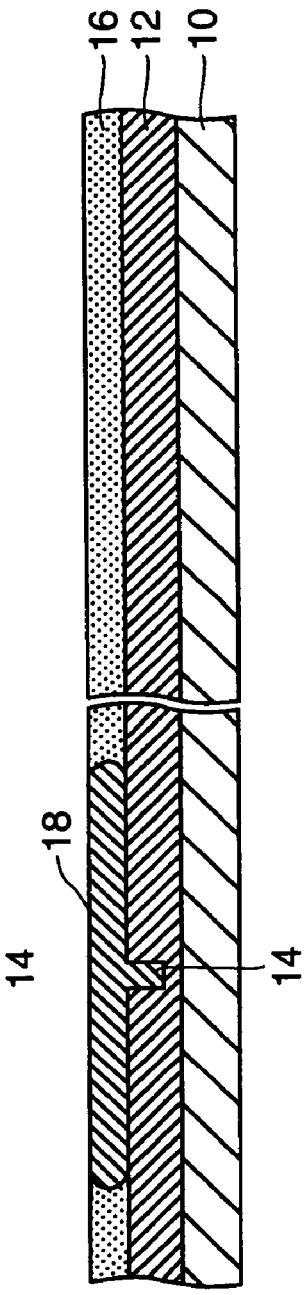

After irradiating the laser, coagulation of silicon firstly starts inside the micro hole 14, and then it reaches to a part in which the amorphous silicon film 16 is almost fully melted (a part adjacent the a surface). At this point, a number of crystal grains occur at a vicinity of the bottom of the micro hole 14. Only one of them reaches to an upper part (an opening part) of the micro hole 14 by setting a sectional dimension (in the embodiment, a diameter of a circle) of the micro hole 14 as nearly the same as or slightly smaller than a dimension of one crystal grain. Accordingly, in the part in which the amorphous silicon film 16 is almost fully melted, a crystal grows from the one crystal grain reached to the upper part of the micro hole 14 as the crystal grain serves as a nucleus. As a result, in the drive circuit region in which the micro hole 14 is formed, a silicon film 18 of a substantially single crystalline state (hereinafter single crystalline semiconductor film) is formed as the micro hole 14 as a center. In contrast, in the display pixel region in which the micro hole 14 is not formed, a silicon film 16 of a micro-polycrystalline state (hereinafter micro-polycrystalline semiconductor film) is formed after fully melting the amorphous silicon film 16. Refer to FIG. 2D.

Consequently, the single crystalline semiconductor film 18 has an effect in which less defects is present inside the film, and trapping level density near the center part of the forbidden band in energy band is low from electrical characteristics point of view of semiconductor films. In addition, the film 18 has another effect in which barriers to flowing carriers such as electrons or positive holes can drastically be reduced because it is mostly deemed that no crystal boundaries exist.

Figure 3:
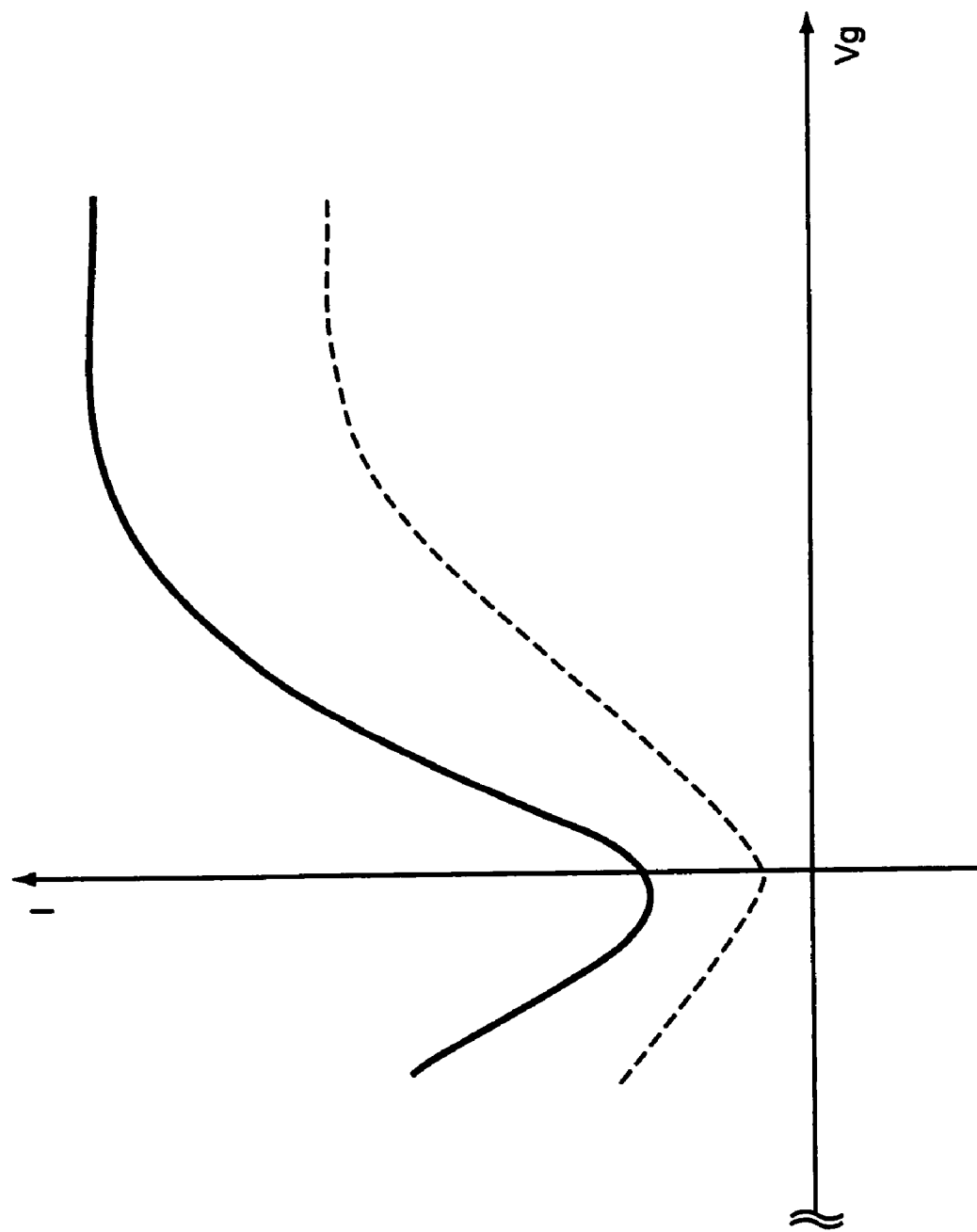
FIG. 3 is a diagram exemplifying characteristics of each TFT according to the first embodiment.

FIG. 3 is a diagram exemplifying characteristics of a TFT using a single crystalline semiconductor film and a TFT using a micro-polycrystalline semiconductor film. In FIG. 3, the characteristic of the TFT using the single crystalline semiconductor film is shown in full line, while the characteristic of the TFT using the micro-polycrystalline semiconductor film is shown in dot-line. Also, in FIG. 3, the longitudinal axis shows current I flowing to the TFT, while the lateral axis shows gate voltage Vg. As shown in FIG. 3, the TFT using the single crystalline semiconductor film can perform higher switching operation whereas has a larger off current as compared with the TFT using the micro-polycrystalline semiconductor film. In other words, the TFT using the micro-polycrystalline semiconductor film has a smaller off current, but its switching operation is slower as compared with the TFT using the single crystalline semiconductor film.

By utilizing the characteristic of each TFT, a drive circuit that can operate at high speed, and a pixel circuit that can suppress an occurrence of body floating effect or off currents are achieved using TFTs as follows: a TFT in which the single crystalline semiconductor film is employed for an active layer (source, drain, or channel forming regions) is used for the drive circuit, while a TFT in which the micro-polycrystalline semiconductor film is employed for an active layer is used for the pixel circuit. In the following processes forming of TFTs included in the drive circuit will be described as an example, but forming of TFTs included in the pixel circuit will be omitted in order to avoid overlapped descriptions.

Element Forming Process

Figure 4A:
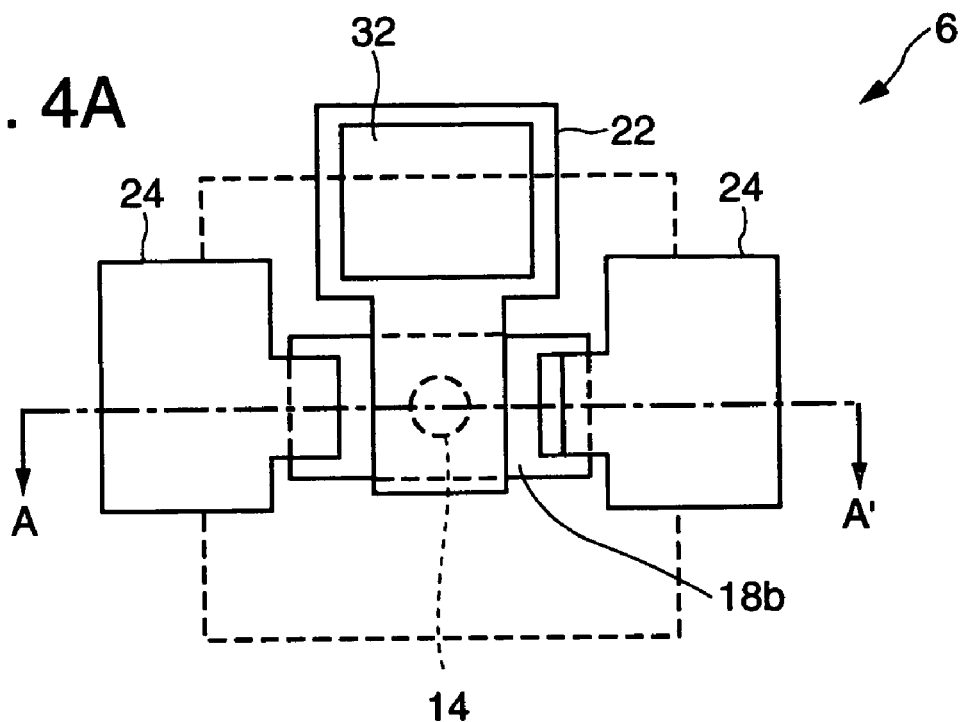
FIGS. 4A and 4B are plan views of TFTs included in a drive circuit according to the first embodiment.
Figure 4B:
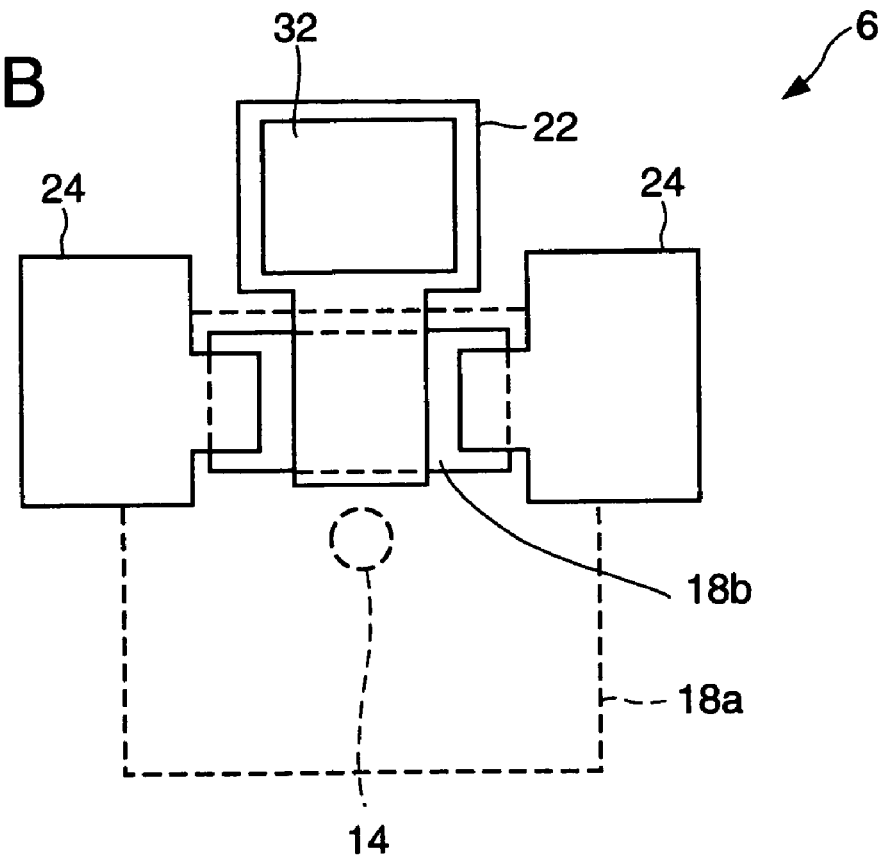

FIGS. 4A and 4B are plan views illustrating TFTs included in the drive circuit. FIGS. 5A through 5D are sectional views taken along line A–A' in FIG. 4A.

Figure 5A:
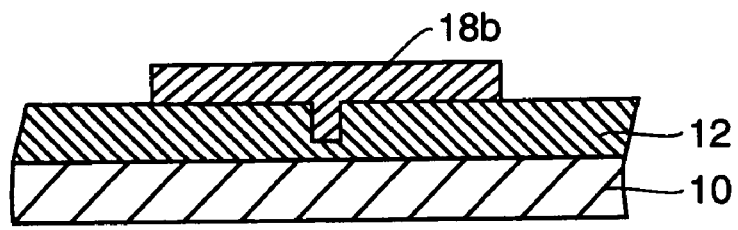
FIGS. 5A through 5D are sectional views taken along line A–A' in FIG. 4A.

Firstly, as shown in FIG. 5A, a silicon film is patterned on the silicon oxide film 12 in the drive circuit region so as to form a single crystalline semiconductor film used for forming the TFT. Here, for convenience of description, a silicon film before patterning is labeled as a silicon film 18a, while a silicon film after patterning is labeled as a silicon film 18b. In FIG. 4A, the silicon film 18a before patterning is shown in dot line, while the silicon film 18b after patterning is shown in full line.

As shown in FIG. 4A, in the embodiment, a part including the micro hole 14 within a surface of the silicon film 18a is patterned so that the part is used as the single crystalline semiconductor film 18b of the TFT. In other words, the patterning is carried out so that the micro hole 14 that serves as a starting point of crystallization of the single crystalline semiconductor film 18b is disposed at a part of the single crystalline semiconductor film 18b. However, the invention is not limited to this, but for example as shown in FIG. 4B, a patterning may be carried out so that the micro hole 14 is disposed at a peripheral part of the single crystalline semiconductor film 18b (in other words, a region in which the micro hole 14 is formed is not included in a part used as the single crystalline semiconductor film 18b). With a patterning carried out so that the single crystalline semiconductor film 18b is disposed apart from the micro hole 14 as described above, the single crystalline semiconductor film 18b can be achieved in which characteristics of the crystal are more stable.

Figure 5B:
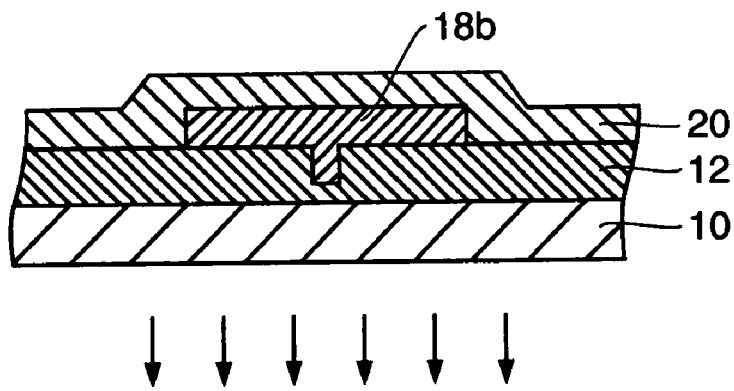

Next, as shown in FIG. 5B, a silicon oxide film 20 is formed on the silicon oxide film 12 and the single crystalline semiconductor film 18b. For example, the silicon oxide film 20 can be formed by means of an electron cyclotron resonance PECVD (ECR-CVD) or a PECVD. The silicon oxide film 20 functions as a gate insulation film of TFT.

Figure 5C:
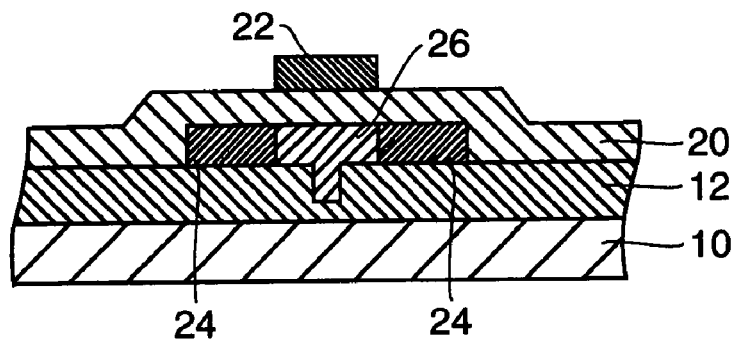

Then, as shown in FIG. 5C, a metal thin film such as tantalum or aluminum is formed by sputtering. Subsequently, a patterning is carried out so as to form a gate electrode 22. Next, impurity ions serving as a donor or acceptor are implanted using the gate electrode 22 as a mask, so that a source/drain region 24 and a channel forming region 26 are self-alignmently formed to the gate electrode 22.

For example, in a case where NMOS transistors are fabricated, phosphorous (P) is implanted into the source/drain region as impurity ions at a concentration of $1 \times 10^{16}$ $cm^{-2}$. Then, XeCl eximer laser light is irradiated with irradiation energy of approximately 400 $mJ/cm^2$ or heat treatment is performed at a temperature of approximately 250 to 450 degrees centigrade so as to activate the impurity element.

Figure 5D:
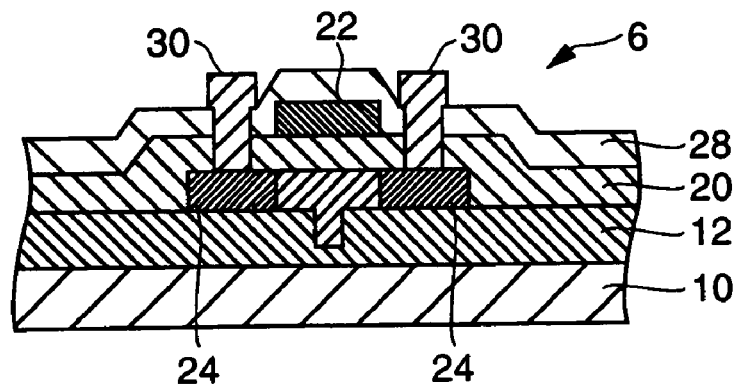

Next, as shown in FIG. 5D, a silicon oxide film 28 is formed on an upper surface of the silicon oxide film 20 and the gate electrode 22. For example, the silicon oxide film 28 is formed to a thickness of approximately 500 nm by means of a PECVD. Then, contact holes are provided in the silicon oxide films 20 and 28 so as to reach the source/drain region 24. Next, a source/drain electrode 30 is formed inside the contact holes and a peripheral part of the contact holes on the silicon oxide film 28. The source/drain electrode 30 may be formed with aluminum deposited by means of sputtering, for example. In addition, a contact hole is provided in the silicon oxide film 28 so as to reach the gate electrode 22. Then, a terminal electrode 32 (refer to FIG. 4A) for the gate electrode 22 is formed. With processes as described above, the TFT 6 included in the drive circuit according to the invention is fabricated.

As described above, according to the embodiment, a semiconductor film of a substantially single crystalline state is formed in the drive circuit region by disposing the micro hole 14 serving as a starting point of a crystallization of the semiconductor film in the drive circuit region in which a drive circuit is formed, while a semiconductor film of a substantially polycrystalline state is formed in the pixel circuit region. Consequently, a drive circuit that can operate at high speed, and a pixel circuit that can suppress an occurrence of body floating effect and off currents are achieved by the following constructions: the drive circuit is constructed by a TFT having the semiconductor film of the substantially single crystalline state; and the pixel drive circuit is constructed by a TFT having the semiconductor film of the substantially polycrystalline state. Moreover, a laser annealing method is employed as heat treatment. This makes it possible to reduce temperatures in processes as compared with a case in which a reduced pressure epitaxy or a solid phase epitaxy is employed (refer to the related art), and also to use inexpensive glass substrates or plastic substrates as a substrate.

B. Second Embodiment

Figure 6:
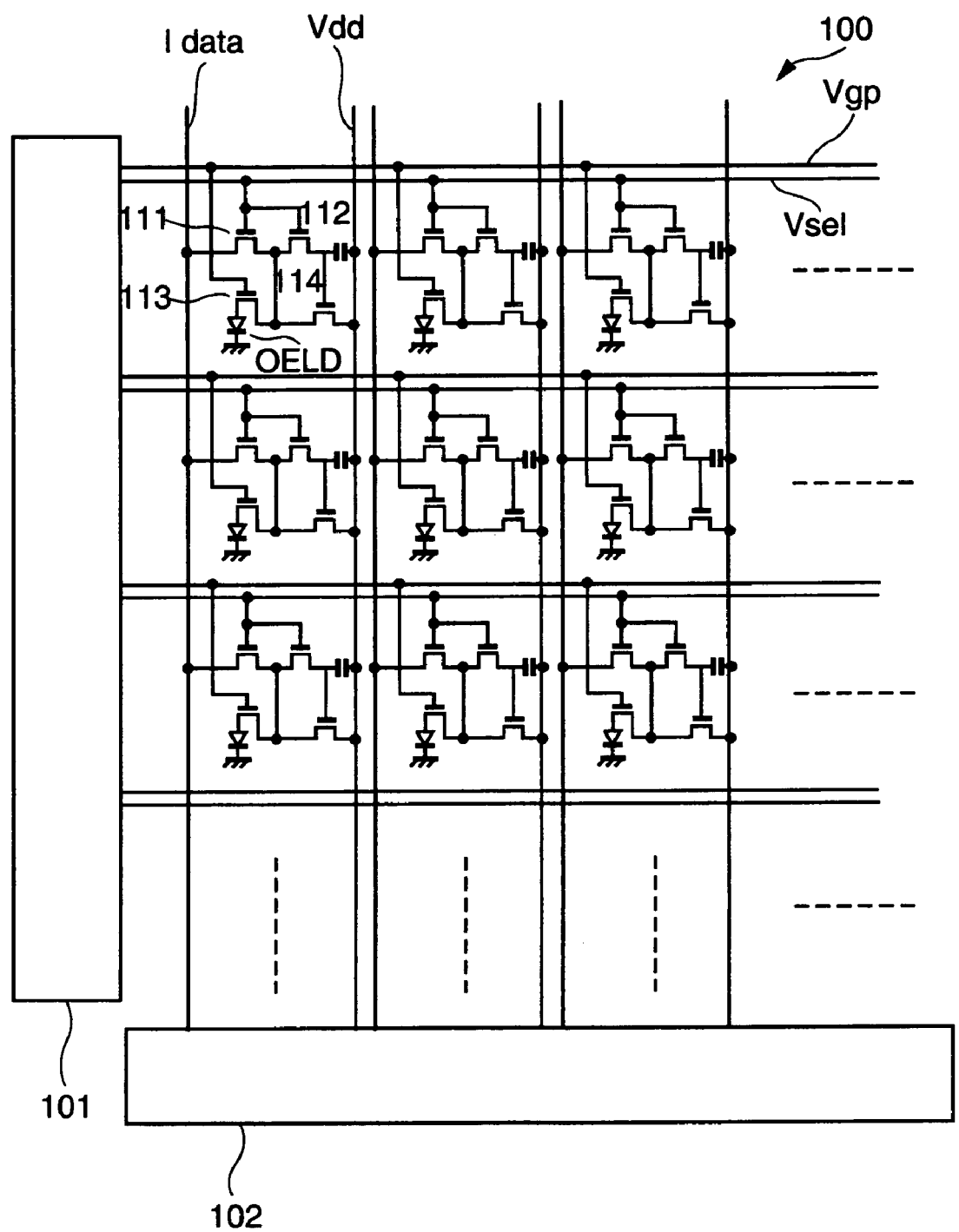
FIG. 6 is a diagram illustrating a construction of an organic EL display device according to a second embodiment of the invention.

FIG. 6 shows a connection diagram of an organic EL display device 100 that is a type of electro-optical devices according to a second embodiment of the invention.

The pixel circuit formed in each pixel region is constructed by including a luminescent layer OELD that can emit light by field emission effect, a storage capacitor storing a current for driving the OELD, and TFTs 111 through 114 having the micro-polycrystalline semiconductor film. A drive circuit 101 and a drive circuit 102 that are formed in the drive circuit region and constructed by including a plurality of TFTs (not shown) having the single crystalline semiconductor film. From the drive circuit 101, a scan line Vsel and a luminescence control line Vgp are supplied to each corresponding pixel circuit, while from the drive circuit 102, a data line Idata and a power supply line Vdd are supplied to each corresponding pixel circuit. By controlling the scan line Vsel and the data line Idata, each corresponding luminescent part OELD can be controlled to emit light. The above-mentioned drive circuit is only an example of circuits in which field emission elements are used as luminescent elements. Thus, other circuit constructions also can be achieved.

C. Third Embodiment

Figure 7A:
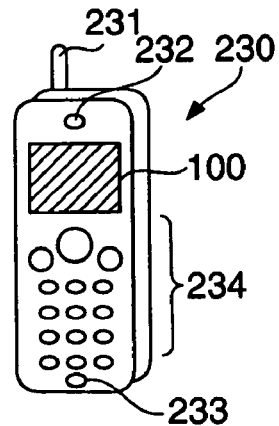
FIGS. 7A through 7F are diagrams exemplifying each electronic device according to a third embodiment of the invention.
Figure 7B:
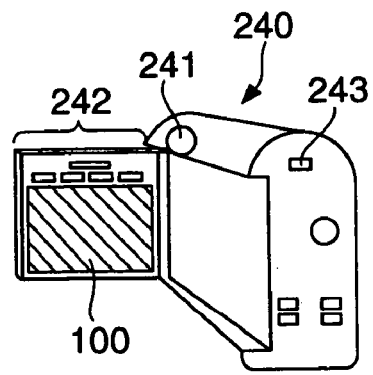

FIGS. 7A through 7F are diagrams exemplifying electronic devices according to a third embodiment of the invention. FIG. 7A shows a cellular phone manufactured by a manufacturing method according to the invention. A cellular phone 230 includes an electro-optical device (display panel) 100, an antenna 231, a voice output part 232, a voice input part 233, and an operation part 234. The invention is applied to manufacture a substrate (active matrix substrate) in which a pixel circuit and a drive circuit are provided in the display panel 100, for example. FIG. 7B shows a video camera manufactured by a manufacturing method according to the invention. A video camera 240 includes the electro-optical device (display panel) 100, an image receiving part 241, an operation part 242, and a voice input part 243. The invention is applied to manufacture a substrate (active matrix substrate) in which a pixel circuit and a drive circuit are provided in the display panel 100, for example.

Figure 7C:
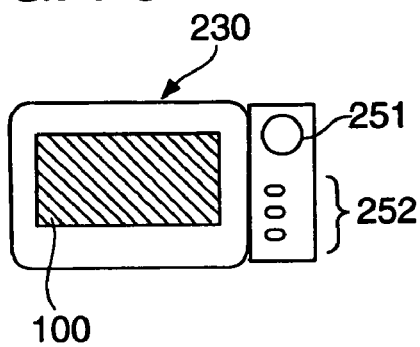

FIG. 7C shows a portable personal computer equipped with a semiconductor device manufactured by a manufacturing method according to the invention, etc. A computer 250 includes the electro-optical device (display panel) 100, a camera part 251, and an operation part 252. The invention is applied to manufacture a substrate (active matrix substrate) in which a pixel circuit and a drive circuit are provided in the display panel 100, for example.

Figure 7D:
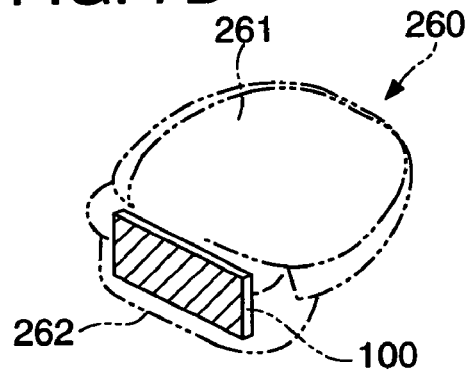
Figure 7E:
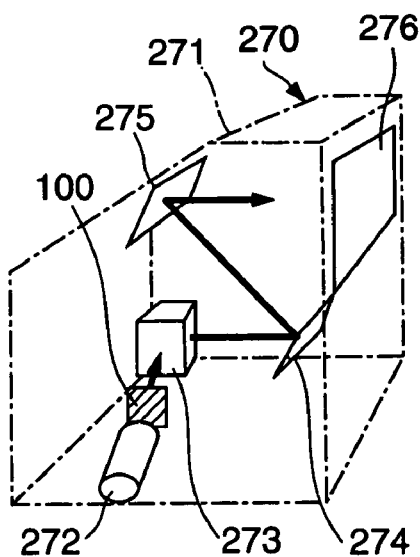
Figure 7F:
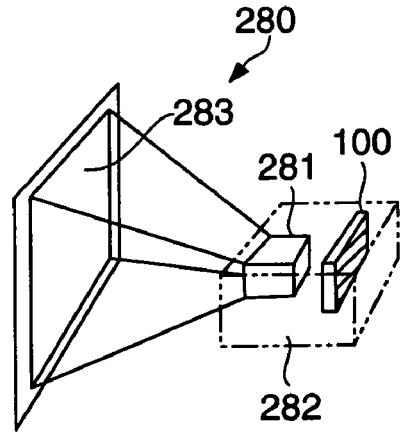

FIG. 7D shows a head mount display equipped with a semiconductor device manufactured by a manufacturing method according to the invention, etc. A head mount display 260 includes the electro-optical device (display panel) 100, a band 261, and an optical system storage part 262. The invention is applied to manufacture a substrate (active matrix substrate) in which a pixel circuit and a drive circuit are provided in the display panel 100, for example. FIG. 7E shows a rear projector equipped with a semiconductor device manufactured by a manufacturing method according to the invention, etc. A rear projector 270 includes the electro-optical device (light modulator) 100, a light source 272, a combining optical system 273, mirrors 274 and 275 in a case 271. The invention is applied to manufacture a substrate (active matrix substrate) in which a pixel circuit and a drive circuit are provided in the light modulator 100, for example. FIG. 7F shows a front projector equipped with a semiconductor device manufactured by a manufacturing method according to the invention, etc. A front projector 280 includes the electro-optical device (image display source) 100 and an optical system 281 in a case 282. The projector displays images on a screen 283. The invention is applied to manufacture a substrate (active matrix substrate) in which a pixel circuit and a drive circuit are provided in the image display source 100, for example.

The invention is not limited to the above-mentioned examples, but can apply to manufacture all electronic devices, or the like. For example, the invention can apply to fax-machines built-in display, digital camera finders, portable TVs, DSP devices, PDAs, electronic notebooks, electronic bulletin boards, advertising displays, IC cards, etc. It should be noted that the invention is not limited to the above-mentioned embodiments, and various modifications and changes can be made without departing from the spirit and scope of the invention. For example, in the above-mentioned embodiment, a silicon film is described as an example of semiconductor films, however, the semiconductor films are not limited to this. Also, in the above-mentioned embodiment, the TFT (thin film transistor) is exemplified as an example of active elements formed using a crystalline semiconductor film according to the invention. However, the semiconductor elements are not limited to this, but other active elements can be applied.

What is claimed is:

1. An active matrix substrate, comprising:
   a load circuit including a first active element performing a switching operation of a load, the first active element including a semiconductor film of a substantially polycrystalline state;
   a drive circuit including a second active element controlling driving the load, the second active element including a semiconductor film of a substantially single crystalline state, a part of a hole being provided to one of a part and a peripheral part of the semiconductor film, the hole functioning a starting point for crystallizing the semiconductor film; and
   a substrate on a same plane of which the load circuit and the drive circuit are formed.

2. The active matrix substrate according to claim 1, the load circuit including a plurality of scan lines, a plurality of data lines provided so as to intersect each of the plurality of scan lines, and a plurality of pixel electrodes serving as the load, each being provided at each intersection of at least one of the plurality of scan lines and at least one of the plurality of data lines.

3. The active matrix substrate according to claim 2, the first active element and the second active element being a thin film transistor.

4. An electro-optical device, comprising:
   the active matrix substrate according to claim 3;
   a facing substrate on one surface of which a common electrode is provided, the facing substrate being disposed to the active matrix substrate so that the common electrode and the pixel electrode on the active matrix substrate are faced; and
   a liquid crystal layer sandwiched between the active matrix substrate and the facing substrate.

5. An electronic device comprising the active matrix substrate according to claim 1.

6. A method for manufacturing an active matrix substrate on a same plane of which a load circuit performing a switching operation of a load and a drive circuit controlling driving the load are formed, comprising:
   forming an insulation film on a substrate;
   providing a part of a hole in a region for forming the drive circuit;
   forming a silicon film on the insulation film;
   applying heat treatment uniformly to the silicon film so that a silicon film of a substantially single crystalline state having the hole as a center is formed in a region for forming the drive circuit, while a silicon film of a substantially polycrystalline state is formed in a region for forming the load circuit;
   forming a first active element in the region for forming the load circuit, the first active element performing a switching operation of the load, the first active element having the silicon film of the substantially polycrystalline state as a semiconductor film; and
   forming a second active element in the region for forming the drive circuit, the second active element controlling driving the load, the second active element having the silicon film of the substantially single crystalline state as a semiconductor film.

7. The method for manufacturing an active matrix according to claim 6, in forming the second active element, the second active element being formed so as to have a region excluding a region including the hole in the silicon film of the substantially single crystalline state.

8. The method for manufacturing an active matrix according to claim 6, the heat treatment being uniformly applied to the silicon film by irradiating laser light to the silicon film with a predetermined condition.

* * * * *